United States Patent
Lee et al.

(10) Patent No.: US 8,759,986 B2
(45) Date of Patent: Jun. 24, 2014

(54) SUBSTRATE STRUCTURE AND METHOD OF MANUFACTURING THE SAME

(75) Inventors: Chul Min Lee, Gyeongsangnam-do (KR); Won Hyung Park, Busan (KR); Kyung Jin Heo, Busan (KR); Dek Gin Yang, Chungbuk (KR); Jin Su Yeo, Busan (KR); Sung Wook Chun, Incheon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 117 days.

(21) Appl. No.: 13/373,297

(22) Filed: Nov. 10, 2011

(65) Prior Publication Data

US 2012/0171432 A1 Jul. 5, 2012

(30) Foreign Application Priority Data

Dec. 29, 2010 (KR) .................. 10-2010-0137733

(51) Int. Cl.
*B32B 15/01* (2006.01)

(52) U.S. Cl.
USPC ........... 257/779; 257/780; 257/781; 428/615; 428/618; 428/668; 428/669; 428/670

(58) Field of Classification Search
CPC ...... B32B 15/01; B32B 15/018; C03C 30/00; H01L 24/12; H01L 24/14
USPC ................. 428/209, 615, 618, 668, 669, 670; 257/781, 779, 780
See application file for complete search history.

(56) References Cited

U.S. PATENT DOCUMENTS

| | | | |
|---|---|---|---|
| 4,529,667 A * | 7/1985 | Shiga et al. | 428/646 |
| 6,517,893 B2 * | 2/2003 | Abys et al. | 29/840 |
| 6,740,352 B2 * | 5/2004 | Lee et al. | 427/96.2 |
| 6,773,757 B1 | 8/2004 | Redline et al. | |
| 6,800,555 B2 * | 10/2004 | Test et al. | 438/687 |
| 7,094,068 B2 * | 8/2006 | Huang et al. | 439/70 |
| 7,304,249 B2 * | 12/2007 | Lee et al. | 174/267 |

FOREIGN PATENT DOCUMENTS

| | | |
|---|---|---|
| JP | 10-8262 | 1/1998 |
| JP | 11-229178 | 8/1999 |
| JP | 2007-123883 | 5/2007 |
| KR | 2003-0056430 | 7/2003 |
| KR | 10-2003-0095688 | 12/2003 |
| KR | 10-0688833 | 2/2007 |
| KR | 10-0885673 | 2/2009 |
| KR | 10-2009-0109289 | 10/2009 |

OTHER PUBLICATIONS

Korean Office Action issued Aug. 27, 2012 in corresponding Korean Patent Application No. 10-2010-0137733.
Japanese Office Action mailed Oct. 29, 2013 in corresponding Japanese Application No. 2011-270268.

* cited by examiner

Primary Examiner — Cathy Lam

(57) ABSTRACT

Provided is a substrate structure including: a base substrate on which a conductive pattern is formed; a first plating layer covering the conductive pattern; and a second plating layer covering the first plating layer, wherein the first plating layer includes an electroless reduction plating layer.

6 Claims, 4 Drawing Sheets

| classification | | Embodiment 1 | Embodiment 2 | Embodiment 3 | Embodiment 4 | Embodiment 5 | Embodiment 6 | Embodiment 7 | Embodiment 8 | Embodiment 9 | Embodiment 10 | Embodiment 11 | Embodiment 12 | Embodiment 13 | Embodiment 14 | Embodiment 15 | Embodiment 16 | Embodiment 17 | Comparative example 1 | Comparative example 2 |
|---|---|---|---|---|---|---|---|---|---|---|---|---|---|---|---|---|---|---|---|---|
| Post-treatment | | Not performed | | | | | | | | | | | | | | performed | | | Not performed | |
| Plating layer (μm) | Palladium (alloy) | 0.01 | 0.01 | 0.01 | 0.01 | 0.05 | 0.07 | 0.07 | 0.1 | 0.01 | 0.01 | Palladium-phosphorus 0.01 | Palladium-boron 0.01 | Palladium-phosphorus 0.07 | Palladium-boron 0.05 | 0.01 | 0.01 | 0.03 | | |
| | Silver (alloy) | 0.1 | 0.3 | 1.0 | 2.0 | 0.1 | 0.3 | 1.0 | 2.0 | Silver-selenium 0.35 | Silver-selenium 0.8 | 0.1 | 0.1 | Silver-selenium 0.5 | Silver-selenium 0.5 | 0.1 | 0.1 | 0.2 | 0.1 | |
| | gold | | | | | | | | | | | | | | | | | | | 0.07 |
| | Nickel-phosphorus | | | | | | | | | | | | | | | | | | | 4.5 |
| solderability | Wire bondability (gf) | 675 | 720 | 705 | 720 | 710 | 745 | 690 | 720 | 730 | 715 | 730 | 740 | 700 | 725 | 680 | 695 | 710 | 685 | 710 |
| | Ball spreadability (mmØ) | 1.25 | 1.27 | 1.31 | 1.26 | 1.30 | 1.29 | 1.40 | 1.32 | 1.41 | 1.38 | 1.44 | 1.35 | 1.32 | 1.28 | 1.30 | 1.29 | 1.27 | 1.33 | 1.31 |
| Wire bondability (gf) | | 5.23 | 5.96 | 6.01 | 5.58 | 6.38 | 5.28 | 5.76 | 6.51 | 5.22 | 5.59 | 6.02 | 5.82 | 6.36 | 5.88 | 5.84 | 5.94 | 6.15 | 5.12 | 6.97 |
| Surface insulation resistance (Ω) | | $3.8 \times 10^8$ | $2.9 \times 10^8$ | $4.2 \times 10^8$ | $5.1 \times 10^8$ | $5.0 \times 10^8$ | $4.5 \times 10^8$ | $3.3 \times 10^8$ | $4.8 \times 10^8$ | $4.2 \times 10^8$ | $3.5 \times 10^8$ | $5.1 \times 10^8$ | $6.0 \times 10^8$ | $4.5 \times 10^8$ | $5.5 \times 10^8$ | $4.7 \times 10^6$ | $3.9 \times 10^8$ | $4.1 \times 10^8$ | $6.1 \times 10^8$ | $4.3 \times 10^8$ |
| Flex cracking | phenomenon | no | no | no | no | no | no | no | no | no | no | no | no | no | no | no | no | no | no | yes |
| | Crack initiation times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | More than 20 times | 1.6 times |

SUBSTRATE STRUCTURE AND METHOD OF MANUFACTURING THE SAME

CROSS-REFERENCE TO RELATED APPLICATIONS

This application claims the benefit under 35 U.S.C. Section 119 of Korean Patent Application Serial No. 10-2010-0137733, filed Dec. 29, 2010, which is hereby incorporated by reference in its entirety into this application.

BACKGROUND OF THE INVENTION

1. Field of the Invention

The present invention relates to a substrate structure and a method of manufacturing the same, and more particularly, to a substrate structure capable of preventing corrosion and discoloration of a conductive pattern used as circuit wiring and improving soldering and wire bonding characteristics, and a method of manufacturing the same.

2. Description of the Related Art

In general, a substrate such as a printed circuit board is widely used for packaging of electronic components such as semiconductor integrated circuit (IC) chips. In this substrate, a fine circuit pattern is formed on an insulating substrate. A soldering process is performed on a portion of the circuit board for mounting of the electronic components, and a wire bonding process is performed on another portion of the circuit pattern for electrical connection with the electronic components.

However, since the circuit pattern containing copper is easily corroded, it acts as a factor that deteriorates the soldering and wire bonding characteristics. In order to prevent this, various kinds of plating processes are performed on the copper circuit pattern. There are a silver plating process and a gold plating process that are used as plating processes for preventing corrosion of the copper circuit pattern.

However, since a conventional silver plating process applies an immersion silver plating method, it causes discoloration such as yellowing or blackening through reaction with sulfurous acid gas or chlorine gas in the atmosphere. In this case, soldering characteristics are deteriorated and a short of a circuit pattern occurs due to continuous corrosion of the circuit pattern. Further, since a conventional gold plating process uses a great quantity of relatively expensive gold, there is a problem that manufacturing costs of a circuit board is greatly increased.

SUMMARY OF THE INVENTION

The present invention has been invented in order to overcome the above-described problems and it is, therefore, an object of the present invention to provide a substrate structure capable of preventing corrosion and discoloration of a conductive pattern.

It is another object of the present invention to provide a substrate structure capable of improving soldering and wire bonding characteristics.

It is another object of the present invention to provide a method of manufacturing a substrate structure capable of preventing corrosion and discoloration of a conductive pattern.

It is another object of the present invention to provide a method of manufacturing a substrate structure capable of improving soldering and wire bonding characteristics.

In accordance with one aspect of the present invention to achieve the object, there is provided a substrate structure including: a base substrate on which a conductive pattern is formed; a first plating layer covering the conductive pattern; and a second plating layer covering the first plating layer, wherein the first plating layer includes an electroless reduction plating layer.

In accordance with an embodiment of the present invention, the conductive pattern may include copper (Cu), the first plating layer may include silver (Ag), and the second plating layer may include palladium (Pd).

In accordance with an embodiment of the present invention, the conductive pattern may include a first pattern on which a soldering process for mounting of electronic components is performed and a second pattern on which a wire bonding process for electrical connection with electronic components is performed, wherein the second plating layer covering the second pattern may have a thickness larger than that of the first plating layer covering the first pattern.

In accordance with an embodiment of the present invention, the second plating layer covering the second pattern may have a thickness greater than 5 μm.

In accordance with an embodiment of the present invention, the second plating layer may include an immersion substitution plating layer.

In accordance with an embodiment of the present invention, the substrate structure may further include a resist pattern which covers the base substrate while exposing the conductive pattern.

In accordance with an embodiment of the present invention, the first plating layer may be made of a silver alloy, wherein the silver alloy may consist of 99.000 to 99.000 wt % of silver and 0.001 to 1.0 wt % of at least one metal of selenium and lead.

In accordance with an embodiment of the present invention, the second plating layer may be made of a palladium alloy, wherein the palladium alloy may consist of 92 to 99.9 wt % of palladium and 0.1 to 8.0 wt % of at least one metal of phosphorus (P) and boron (B).

In accordance with another aspect of the present invention to achieve the object, there is provided a method of manufacturing a substrate structure including the steps of: forming a conductive pattern on a base substrate; forming a first plating layer on the conductive pattern; and forming a second plating layer on the first plating layer, wherein the step of forming the first plating layer includes the step of forming an electroless reduction plating layer on the conductive pattern.

In accordance with an embodiment of the present invention, the step of forming the conductive pattern may include the steps of forming a resist pattern, which exposes a pattern forming region of the base substrate, on the base substrate and forming a copper plating layer on the pattern forming region by using the resist pattern as a plating resist, and the step of forming the first plating layer may include the step of performing an electroless reduction plating process on the base substrate by using the resist pattern as a plating resist.

In accordance with an embodiment of the present invention, the step of forming the conductive pattern may include the steps of forming a resist pattern, which exposes a pattern forming region of the base substrate, on the base substrate and forming a copper plating layer on the pattern forming region by using the resist pattern as a plating resist, the step of forming the first plating layer may include the step of forming a silver plating layer on the conductive pattern by using the resist pattern as a plating resist, and the step of forming the second plating layer may include the step of forming a palladium plating layer on the silver plating layer by using the resist pattern as a plating resist.

In accordance with an embodiment of the present invention, the step of forming the first plating layer may include the step of forming a silver plating layer with a thickness greater than 5 µm on the conductive pattern, and the method of manufacturing a substrate structure may further include the step of performing a wire bonding process for electrical connection with electronic components on the conductive pattern.

In accordance with an embodiment of the present invention, the step of forming the first plating layer may include the step of forming a silver plating layer with a thickness less than 5 µm on the conductive pattern, and the method of manufacturing a substrate structure may further include the step of performing a soldering process for mounting of electronic components on the conductive pattern.

In accordance with an embodiment of the present invention, the step of forming the first plating layer may include the steps of forming a plating layer with a thickness greater than 5 µm on the conductive pattern by an electroless reduction plating method and forming a plating layer with a thickness less than 5 µm on the conductive pattern by an immersion substitution plating method.

In accordance with an embodiment of the present invention, the step of forming the first plating layer may include the steps of forming a plating layer with a thickness greater than 5 µm on the conductive pattern and forming a plating layer with a thickness less than 5 µm on the conductive pattern, wherein the step of forming the plating layer with a thickness greater than 5 µm may use the same plating method as the step of forming the plating layer with a thickness less than 5 µm but may be performed by increasing a plating process time.

In accordance with an embodiment of the present invention, the step of forming the first plating layer may include the step of forming a silver plating layer on the conductive pattern by an electroless reduction plating method, wherein the electroless reduction plating method may use a plating solution including silver nitrate as a source of metal silver, Rochelle salt as a reducing agent, ethylenediaminetetraacetic acid (EDTA) as a complexing agent, and 3-iodotyrosine as a stabilizer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 6 is a view showing test results for various specific embodiments of the present invention.

DETAILED DESCRIPTION OF THE PREFERABLE EMBODIMENTS

Figure 1:
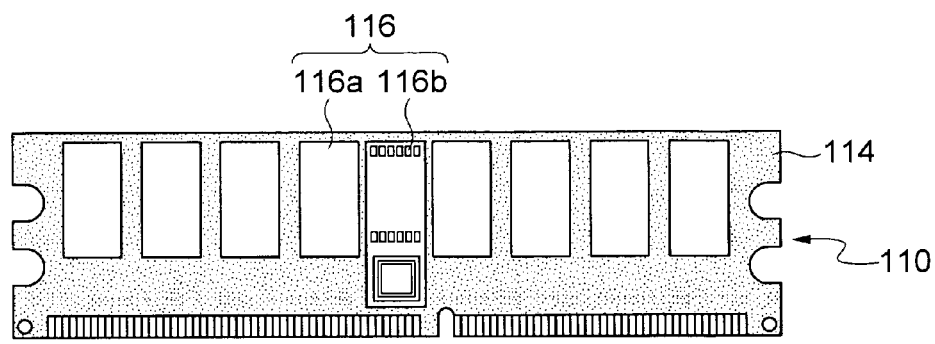
FIG. 1 is a view showing a shape of a circuit board for applying technology of a substrate structure in accordance with an embodiment of the present invention.

Advantages and features of the present invention and methods of accomplishing the same will be apparent with reference to the following embodiments described in detail in conjunction with the accompanying drawings. However, the present invention is not limited to the following embodiments but may be embodied in various other forms. The embodiments are provided to complete the disclosure of the present invention and to completely inform a person with average knowledge in the art of the scope of the present invention. Like reference numerals refer to like elements throughout the specification.

Terms used herein are provided to explain embodiments, not limiting the present invention. Throughout this specification, the singular form includes the plural form unless the context clearly indicates otherwise. The terms "comprise" and/or "comprising" specify the existence of components, steps, operations, and/or substrates, which are referred to, and do not exclude the existence or addition of one or more different components, steps, operations, and/or substrates.

Further, the embodiments described in the specification will be described with reference to cross-sectional views and/or plan views which are ideal exemplary drawings of the present invention. In the drawings, the thicknesses of layers and regions are extended in order to effectively describe technical contents. Therefore, a form of the exemplary drawing may be modified by a manufacturing method and/or tolerance. Accordingly, the embodiments of the present invention are not limited to a specific form but include a change of a form generated in accordance with a manufacturing process. For example, a right-angle etching region may have a round shape or a shape having predetermined curvature. As a result, regions illustrated in the drawings have schematic attributes and shapes of the regions illustrated in the drawings are used for illustrating specific forms of a substrate and a conductive pattern and not for limiting the scope of the present invention.

Hereinafter, a substrate structure and a method of manufacturing the same in accordance with an embodiment of the present invention will be described in detail with reference to the accompanying drawings.

FIG. 1 is a view showing a shape of a circuit board for applying technology of a substrate structure in accordance with an embodiment of the present invention. Referring to FIG. 1, a circuit board 100 for applying technology of a substrate structure in accordance with an embodiment of the present invention may be a high density printed circuit board. For example, the high density printed circuit board may include a printed circuit board 110 on which a predetermined conductive pattern 116 is formed. The conductive pattern 116 may include a first pattern 116a on which an electronic component (not shown) is mounted and a second pattern 116b for wire bonding with a semiconductor. The first pattern 116a may be a circuit pattern on which a soldering process is performed for mounting of semiconductor integrated circuit (IC) chips or various kinds of passive devices. In contrast, the second pattern 116b may be a circuit pattern to which a bonding wire (not shown) is bonded for electrical connection with the electronic component or various kinds of semiconductors.

Figure 2:
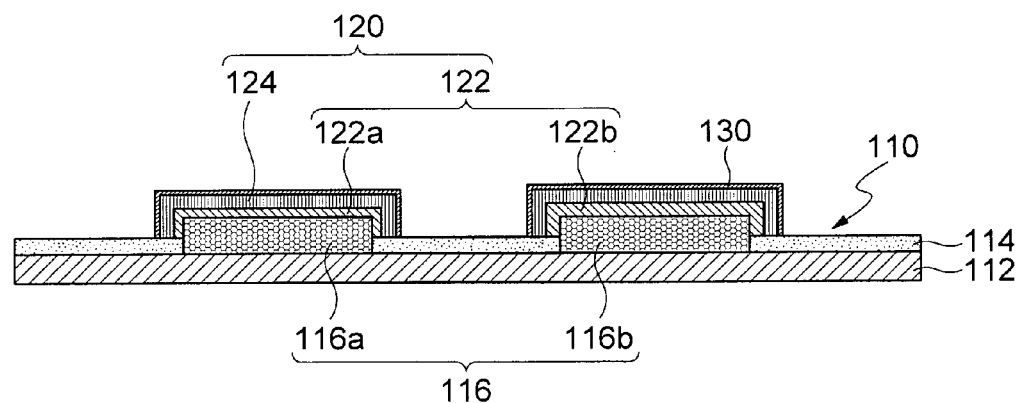
FIG. 2 is a side view showing a substrate structure in accordance with an embodiment of the present invention.
Figure 3:
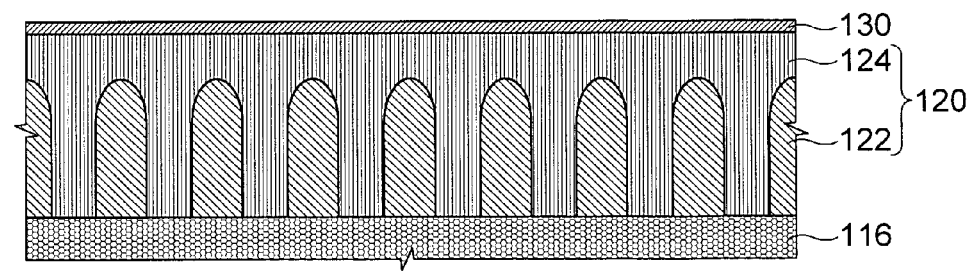
FIG. 3 is an enlarged view of conductive pattern and plating layer portions shown in FIG. 2.

FIG. 2 is a side view showing a substrate structure in accordance with an embodiment of the present invention, and FIG. 3 is an enlarged view of conductive pattern and plating layer portions shown in FIG. 2. Referring to FIGS. 1 to 3, a substrate structure 100 in accordance with an embodiment of the present invention may be a structure including a circuit board 110 with a conductive pattern 116 described above with reference to FIG. 1. The substrate structure 100 may include the circuit board 110 and a plating layer 120 formed on the conductive pattern 116 of the circuit board 110.

The circuit board 110 may include a base substrate 112, a resist pattern 114 covering the base substrate 112 while exposing a circuit pattern forming region of the base substrate 112, and the conductive pattern 116 formed in the region of the base substrate 112 region, which is selectively exposed by the resist pattern 114.

The base substrate 112 may be a base for manufacturing of the circuit board 110. The base substrate 112 may include an insulating substrate for manufacturing of a printed circuit board. The base substrate 112 may include an insulating substrate made of a resin material. The resist pattern 114 may be a layer made of a photo solder resist (PSR). And, as described above with reference to FIG. 1, the conductive pattern 116 may include a first pattern 116a and a second pattern 116b. The first and second patterns 116a and 116b may be copper plating layers formed by a copper plating process. These first and second patterns 116a and 116b may be used as circuit wirings of the substrate structure 100.

The plating layer 120 may cover a surface of the conductive pattern 116, which is selectively exposed by the resist pattern 114. As an example, the plating layer 120 may include a first plating layer 122 and a second plating layer 124 which are sequentially formed on the conductive pattern 116.

The first plating layer 122 may cover the conductive pattern 116 to improve soldering or wire bonding characteristics of the conductive pattern 116. As an example, the first plating layer 122 may be a silver plating layer containing silver (Ag). The first plating layer 122 may be a silver plating layer made only of pure silver. Otherwise, the first plating layer 122 may be a sliver alloy plating layer made of silver and other metals. When the first plating layer 122 is made of a silver alloy, the first plating layer 122 may consist of about 99.000 to 99.999 wt % of sliver and at least one metal of about 0.001 to 1.0 wt % of selenium (Se) and lead (Pb). The first plating layer 122 made of a silver alloy can improve soldering characteristics by a capillary phenomenon and improve soldering and wire bonding characteristics by refining the formed sliver particles.

Further, the first plating layer 122 may have a thickness greater than about 0.05 μm. When the first plating layer 122 has a thickness less than 0.05 μm, it is very difficult to control the thickness of the plating layer in a plating process, and it causes deterioration of characteristics of soldering and wiring bonding processes which will be performed on the first plating layer 122 later.

The second plating layer 124 may cover the first plating layer 122 to prevent corrosion and discoloration of the first plating layer 122. As an example, the second plating layer 124 may be a palladium plating layer containing palladium (Pd). The second plating layer 124 may be a palladium plating layer made only of pure palladium. Otherwise, the second plating layer 124 may be a palladium alloy plating layer made of palladium and other metals. When the second plating layer 124 is made of a palladium alloy, the second plating layer 124 may consist of about 92.0 to 99.9 wt % of palladium (Pd) and at least one metal of about 0.1 to 8.0 wt % of phosphorus (P) and boron (B).

Further, the second plating layer 124 may have a thickness of about 0.005 to 2.000 μm. When the second plating layer 124 has a thickness less than 0.005 μm, since the thickness of the second plating layer 124 is relatively too small, it may cause remarkable deterioration of a function of preventing discoloration of the first plating layer 122. In contrast, although the second plating layer 124 has a thickness greater than 2.000 μm, solderability or discoloration preventing effect is slightly improved or almost not improved. Accordingly, it is possible to prevent an increase in manufacturing costs due to an unnecessary increase in the thickness of the plating layer by adjusting the thickness of the second plating layer 124 to less than 2.000 μm.

Further, the substrate structure 100 may further include a coating layer 130 which covers the playing layer 120. The coating layer 130 may be provided to protect the plating layer 120. The coating layer 130 may be an organic coating layer.

Meanwhile, the first plating layer 122 may have a porous structure to increase adhesion with the second plating layer 124. For example, as shown in FIG. 3, the first plating layer 122 may have a porous structure or an uneven structure. In this case, the first plating layer 122 may have a structure in which a plurality of protrusions are protruded toward the outside. Accordingly, due to the porous structure of the first plating layer 122, the second plating layer 124, which is formed on the first plating layer 122 through a subsequent plating process, may be formed to fill between the porous structures of the first plating layer 122. Accordingly, since the first plating layer 122 and the second plating layer 124 have structures bonded closely to each other, it is possible to improve the adhesion between the first plating layer 122 and the second plating layer 124.

Further, the first plating layer (hereinafter, soldering plating layer: 122a) formed on the first pattern 116a may have a thickness different from that of the first plating layer (hereinafter, bonding wire plating layer: 122b) formed on the second pattern 116b. For example, the bonding wire plating layer 122b may have a thickness larger than that of the soldering plating layer 122a. More specifically, the bonding wire plating layer 122b may have a thickness greater than about 5 μm, and the soldering plating layer 122a may have a thickness less than about 5 μm. In this case, the bonding wire plating layer 122b can improve wire bonding characteristics during a wire bonding process which will be performed on the second pattern 116b later.

In order to adjust the thickness of the plating layer, the bonding wire plating layer 122b may be formed by an electroless reduction plating method. When the first plating layer 122 is formed by the electroless reduction plating method, it is possible to increase the thickness of the plating layer 122 compared to an immersion substitution plating method. Specific methods for forming the plating layer will be described later.

As described above, the substrate structure 100 in accordance with an embodiment of the present invention can effectively form the plating layer 120 for preventing corrosion and discoloration of the plating layer for soldering and wire bonding characteristics on the conductive pattern 116 of the circuit board 110. Accordingly, since the substrate structure in accordance with the present invention can prevent corrosion and discoloration of the conductive pattern used as a circuit pattern of a printed circuit board, it is possible to improve the soldering and wire bonding characteristics for the conductive pattern.

Further, the substrate structure 100 in accordance with an embodiment of the present invention can form a sliver plating layer (that is, first plating layer: 122) for improving the soldering and wire bonding characteristics of the conductive pattern 116 on the conductive pattern 116 of the circuit board 110 by an electroless reduction plating method. In this case, it is possible to sufficiently increase a thickness of the silver plating layer. Accordingly, since it is possible to sufficiently increase the thickness of the silver plating layer for preventing the corrosion and discoloration of the conductive pattern used as a circuit pattern of a printed circuit board, it is possible to improve the soldering and wire bonding characteristics for the conductive pattern. Especially, since the substrate structure in accordance with an embodiment of the present invention can effectively form the silver plating layer with a thickness greater than about 5 μm in a wire bonding process requiring a thickness greater than about 5 μm, it is possible to improve characteristics of the wire bonding process.

Continuously, a method of manufacturing a circuit board in accordance with an embodiment of the present invention will be described in detail. Here, repeated description of the circuit board 100 in accordance with the above-described embodiment of the present invention will be omitted or simplified.

Figure 4:
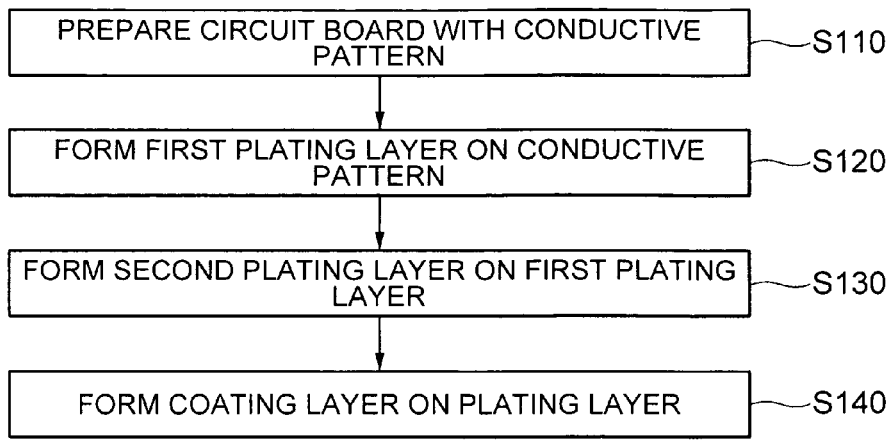
FIG. 4 is a flow chart showing a method of manufacturing a circuit board in accordance with an embodiment of the present invention.

FIG. 4 is a flow chart showing a method of manufacturing a circuit board in accordance with an embodiment of the present invention, and FIGS. 5a to 5d are views for explaining a process of manufacturing a circuit board in accordance with an embodiment of the present invention.

Figure 5A:
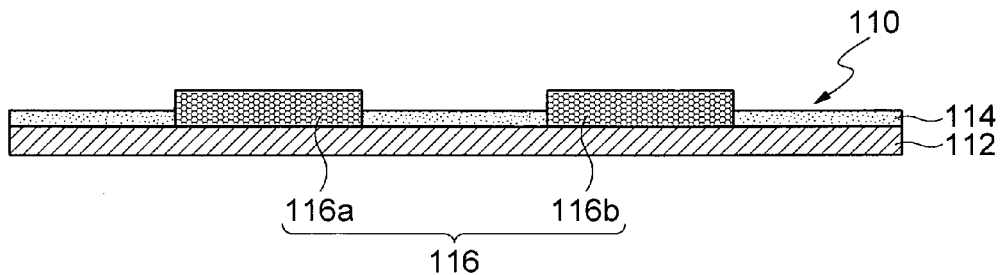
FIGS. 5a to 5d are views for explaining a process of manufacturing a circuit board in accordance with an embodiment of the present invention.

Referring to FIGS. 4 and 5a, a circuit board 110 with a conductive pattern 116 may be prepared (S110). For example, a base substrate 112 may be prepared. The base substrate 112 may be an insulating substrate for manufacturing of a printed circuit board. As an example, the base substrate 112 may be a substrate made of a resin material.

The conductive pattern 116 may be formed on the base substrate 112. The step of forming the conductive pattern 116 may be performed by a photolithography process. As an example, the step of forming the conductive pattern 116 may include the steps of forming a resist pattern 114, which selectively exposes a pattern forming region of the base substrate 112, on the base substrate 112 and forming a plating layer on the pattern forming region of the base substrate 112 by using the resist pattern 114 as a plating resist. At this time, the resist pattern 114 may be a photo solder resist (PSR), and the plating layer may be a metal layer containing copper (Cu). Accordingly, a copper metal pattern may be formed on the pattern forming region of the base substrate 112.

Meanwhile, the conductive pattern 116, which is formed on the base substrate 112, may include a first pattern 116a and a second pattern 116b. The first pattern 116a may be a copper pattern on which a soldering process will be performed later. The second pattern 116b may be a copper pattern on which a wire bonding process will be performed later.

Through the above processes, it is possible to manufacture the circuit board 110 including the base substrate 112, the conductive pattern 116 formed on the base substrate 112, and the resist pattern 114 which selectively exposes the conductive pattern 116.

Figure 5B:
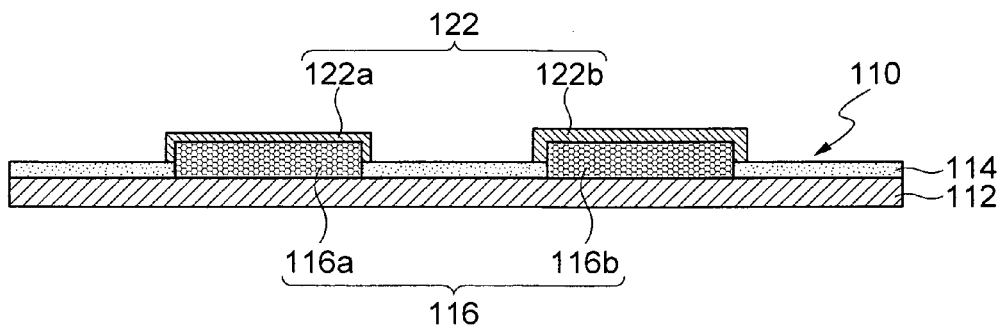

Referring to FIGS. 4 and 5b, a first plating layer 122 may be formed on the conductive pattern 116 (S120). The step of forming the first plating layer 122 may include the step of forming a plating layer on the conductive pattern 116 selectively exposed by the resist pattern 114 by using the resist pattern 114 of the base substrate 112 as a plating resist. The step of forming the first plating layer 122 may include the step of forming a silver (Ag) plating layer on the conductive pattern 116.

The step of forming the silver (Ag) plating layer may use various kinds of plating methods. As an example, the step of forming the silver plating layer may be performed by an immersion substitution plating method. More specifically, the step of forming the silver plating layer may include the steps of acid-cleaning the circuit board 110, removing oxides from a surface of the conductive pattern 116, and immersing the circuit board 110 in a substitution silver plating solution. The step of acid-cleaning the circuit board 110 may be performed at a temperature of about 40 to 50° C. for about 2 to 4 minutes.

Here, the step of removing the oxides from the surface of the conductive pattern 116 may include the step of sequentially performing an etching process of etching the conductive pattern 116 with a thickness of about 5 μm as a target thickness and a washing process as a subsequent process. And the step of immersing the circuit board 110 in the substitution silver plating solution may be performed by immersing the circuit board 110 in the substitution silver plating solution for about 9 seconds to 60 minutes after adjusting a temperature of the substitution silver plating solution to 45 to 55° C. Accordingly, the porous silver plating layer can be formed on the conductive pattern 116. At this time, the reaction formula is as follows.

Reaction Formula (1)

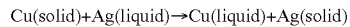

$$Cu(solid)+Ag(liquid) \rightarrow Cu(liquid)+Ag(solid)$$

By the above reaction formula (1), the first plating layer 122, that is, the porous silver plating layer, may be formed on the conductive pattern 116. At this time, the thickness of the first plating layer 122 may be adjusted to about 0.05 to 5 μm. When the thickness of the first plating layer 122 is less than 0.05 μm, it is difficult to control the thickness of the plating layer in the plating process, and characteristics of soldering and wire bonding processes, which will be performed on the first plating layer 122 later, are deteriorated.

As another example, the step of forming the silver plating layer may be performed by an electroless reduction plating method. More specifically, the step of forming the silver plating layer may have a reaction mechanism in which metal ions in an electroless reduction plating solution are reduced to metal and plated by the following reaction formula (2), in comparison with the above-described immersion substitution plating method.

Reaction Formula (2)

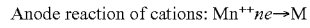

$$\text{Anode reaction of cations: } M^{n++}ne \rightarrow M$$

$$\text{Cathode reaction of reducing agent: } R \rightarrow O+ne$$

By the above method, the first plating layer 122 may be formed on the conductive pattern 116. Here, when the first plating layer 122 is formed by the above electroless reduction plating method, there is an advantage that it is possible to increase the thickness of the first plating layer 122 compared to the immersion substitution plating method. For example, when using the electroless reduction plating method, it is possible to increase the thickness of the first plating layer 122 to greater than about 5 μm. Like this, by the first plating layer 122 having a thickness greater than 5 μm, it is possible to improve the characteristics of the soldering and wire bonding processes which will be performed later.

Just, since metal ions and a reducing agent are present together in an electroless reduction plating solution used for the above electroless reduction plating method, there is a concern about reduction of life of the plating solution due to relatively low solution stability. In order to prevent this, it may be important to select functional additives such as stabilizers. For example, the electroless reduction silver plating solution may include metallic silver (Ag source), a reducing agent, a complexing agent, a stabilizer, a buffer, and a wetting agent. Here, the reducing agent may be at least one of formalin, destrose, Rochelle salt, glyoxal, hydrazine sulfate, dimethylamine boran (DMAB), and triethanolamin. As an example of the electroless reduction plating solution, silver nitrate may be used as a source of metallic silver, Rochelle salt may be used as a reducing agent, ethylenediaminetetraacetic acid (EDTA) may be used as a complexing agent, and 3-iodotyrosine may be used as a stabilizer. Therefore, it is possible to satisfy properties of the electroless reduction silver plating solution and increase the life of the solution.

Meanwhile, the first plating layer 122 may be formed by using pure silver (Ag), but it may be preferred that the first plating layer 122 is made of an alloy containing silver so as to improve soldering characteristics later. It may be possible to provide excellent soldering and wire bonding characteristics by maintaining the appropriate thickness of the first plating layer 122 through plating of pure silver, but it is possible to improve the soldering characteristics by a capillary phenomenon and the soldering and wire bonding characteristics by refining the formed silver particles when the first plating layer 122 is made of a silver alloy containing selenium (Se) or lead (Pb). When the first plating layer 122 is made of a silver alloy, the silver alloy may consist of about 99.000 to 99.999 wt % of sliver and at least one metal of about 0.001 to 1.000 wt % of selenium (Se) and lead (Pb).

Further, as described above, the first plating layer 122 may be formed by various methods such as an immersion substitution plating method and an electroless reduction plating method. The first plating layer 122 may be formed by selectively performing these methods. For example, as described above, it is preferred that the first plating layer 122 is formed to have a thickness less than about 5 µm in terms of soldering characteristics and to have a thickness greater than about 5 µm in terms of wire bonding characteristics. Considering this, it may be relatively advantageous to form the plating layer by an immersion substitution plating method on a portion of the first plating layer 122, which requires relatively high soldering characteristics, and it may be relatively advantageous to form the plating layer by an electroless reduction plating method on a portion of the first plating layer 122, which requires high wire bonding characteristics. When applying this dual composite plating method, it is possible to form the plating layer on the circuit board 110 by an immersion substitution plating method in a state in which the conductive pattern other than the conductive pattern to which formation of the relatively thin plating layer is applied is masked not to be exposed, and it is possible to form the plating layer on the circuit board 110 by an electroless reduction plating method in a state in which the conductive pattern other than the conductive pattern to which formation of the relatively thick plating layer is applied is masked not to be exposed.

Otherwise, by applying a single plating method, not the dual composite plating method, it may be possible to form the first plating layer 122 with different thickness on the conductive pattern as above by increasing a process time of forming the first plating layer 122 formed on the conductive pattern requiring relatively high wire bonding characteristics than a process time of forming the first plating layer 122 formed on the conductive pattern requiring relatively high soldering characteristics.

Figure 5C:
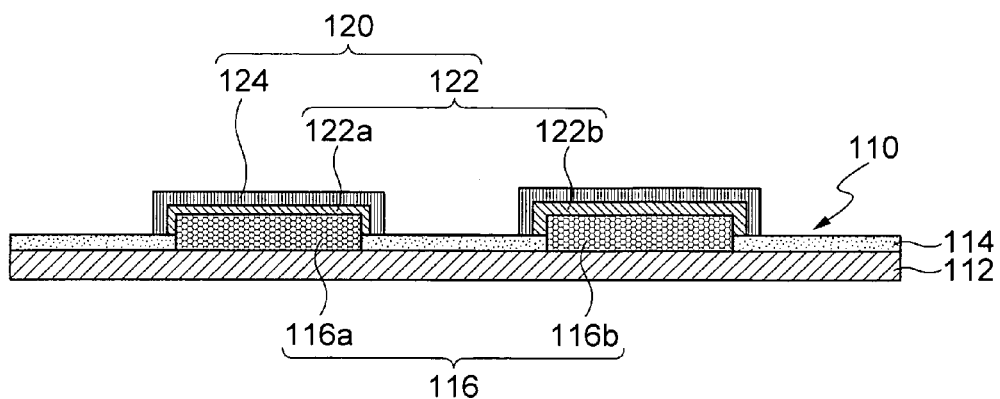

Referring to FIGS. 4 and 5c, a second plating layer 124 may be formed on the first plating layer 122 (S130). The step of forming the second plating layer 124 may include the step of forming a plating layer on the conductive pattern 116 selectively exposed by the resist pattern 114 by using the resist pattern 114 of the circuit board 110 as a plating resist. The step of forming the second plating layer 124 may include the step of forming a palladium (Pd) plating layer on the conductive pattern 116 on which the first plating layer 122 is formed.

As an example, the step of forming the palladium (Pd) plating layer may be performed by an immersion plating method using a substitution reaction. More specifically, the step of forming the palladium plating layer may form the palladium plating layer on the silver plating layer by a substitution plating method according to a difference of ionization tendency by immersing the circuit board 110 in a substitution palladium plating solution after performing a washing process on the first plating layer 122. At this time, the palladium plating solution may have a temperature of about 30 to 60° C., and a plating process time may be adjusted to about 30 seconds to 20 minutes. Here, the palladium plating layer may be formed in such a way to fill a space portion of the porous first plating layer 122. Accordingly, the second plating layer 124 having a dense structure capable of greatly increasing adhesion with the first plating layer 122 can be formed on the first plating layer 122. At this time, the reaction formula is as follows.

Reaction Formula (3)

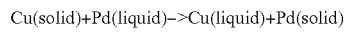

Cu(solid)+Pd(liquid)−>Cu(liquid)+Pd(solid)

Through the above process, the plating layer 120 consisting of the first plating layer 122 and the second plating layer 124 may be formed on the conductive pattern 116 selectively exposed by the resist pattern 114.

Here, in the process of forming the second plating layer, since particles of the palladium plating layer formed between particles of the first plating layer 122, that is, the silver plating layer, play roles of barriers, it is possible to prevent migration occurred during single silver plating. Further, the second plating layer 124 can prevent the first plating layer 122 from being discolored or oxidized by sulfurous acid gas or moisture in the air due to nature of silver metal and thus can prevent soldering and wire bonding characteristics from being deteriorated later.

Meanwhile, the second plating layer 124 may be formed by using pure palladium (Pd), but it may be preferred that the second plating layer 124 is made of an alloy containing palladium. When the second plating layer 124 is made of a palladium alloy, the second plating layer 124 may be made of about 92.0 to 99.9 wt % of palladium (Pd) and at least one metal of about 0.1 to 8.0 wt % of phosphorus (P) and boron (B).

Further, the second plating layer 124 may be formed so that a thickness of the second plating layer 124 is adjusted to about 0.005 to 2.000 µm. When the thickness of the second plating layer 124 is less than 0.005 µm, since the thickness of the second plating layer 124 is relatively too small, a function of preventing discoloration of the first plating layer 122 may be remarkably deteriorated. In contrast, although the thickness of the second plating layer 124 is greater than 2.000 µm, solderability or discoloration prevention effect may be slightly improved or almost not improved. Accordingly, it is possible to prevent an increase in manufacturing costs due to an unnecessary increase in the thickness of the plating layer by adjusting the thickness of the second plating layer 124 to less than 2.000 µm.

In the above-described embodiment, although it is described as an example that the second plating layer 124 is formed by an immersion plating method using a substitution reaction, the second plating layer 124 may be formed by various plating methods. For example, the second plating layer 124 may be formed by an electroless reduction plating method of forming a palladium alloy of palladium-phosphorous (Pd—P) or palladium-boron (Pd—B) by a reduction reaction using sodium hypophosphite or borate as a reducing agent.

Figure 5D:
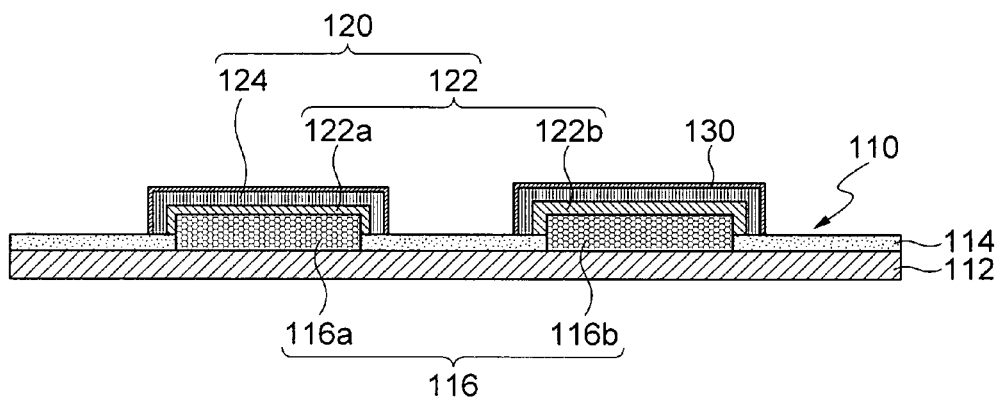

Referring to FIGS. 4 and 5d, a coating layer 130 may be formed on the plating layer 120 (S140). The step of forming the coating layer 130 may be a process performed for protection of the first and second plating layers 122 and 124. For example, the step of forming the coating layer 130 may include the step of forming an organic coating layer on a surface of the second plating layer 124 to cover the second plating layer 124 of the plating layer 120, which is exposed by the resist pattern 114. The process of forming the coating layer 130 may be selectively performed.

As described above, the method of manufacturing a circuit board in accordance with an embodiment of the present invention manufactures the circuit board 110 by forming the conductive pattern 116, which is used as a circuit pattern, on the base substrate 112, forms the first plating layer 122 on the conductive pattern 116, and forms the second plating layer 124, that is, the palladium plating layer, on the first plating layer 122 to prevent corrosion and discoloration of the first plating layer 122. Accordingly, the method of manufacturing a circuit board in accordance with the present invention can improve characteristics of soldering and wire bonding processes later by preventing corrosion and discoloration of a plating layer for soldering and wire bonding characteristics on a conductive pattern used as a circuit pattern of a printed circuit board.

Further, the method of manufacturing a circuit board in accordance with the present invention can form a silver plating layer by an electroless reduction plating process after manufacturing the circuit board 110 with the conductive pattern 116. Especially, when the silver plating layer is formed by the electroless reduction plating process, it is possible to improve bonding characteristics of a bonding wire requiring a relatively thick silver plating layer by effectively increasing the thickness of the silver plating layer. Accordingly, the method of manufacturing a circuit board in accordance with the present invention can improve characteristics of a bonding wire by effectively forming a silver plating layer with a desired thickness on a conductive pattern through an electroless reduction plating process.

Hereinafter, comparison results of a plating layer in accordance with specific embodiments of the present invention and a conventional plating layer and characteristic test results for results to which technology of the present invention is applied will be described in detail.

Pretreatment Process

A photo solder resist layer (Taiyo ink, product name: AS-303) is formed on a portion of a printed circuit board (rigid printed circuit board, size: 400×505 mm, thickness: 0.2±0.02 mm, thickness of copper layer: 12 μm) except a soldering portion requiring solderability with a solder ball, degreased at a temperature of 45° C. for 3 minutes (SAC 161H of YMT. Co. Ltd. is used), and etched by about 0.5 to 1.0 μm to remove oxides of a copper layer (CPA-1140 of YMT. Co. Ltd. is used).

After that, a porous silver plating layer is made of silver or a silver alloy on the printed circuit board by substitution or reduction plating. The substitution silver plating process is performed through the steps of preliminary immersion treatment and substitution silver main treatment, and the preliminary immersion is performed at a room temperature for 1 minute by using a substitution silver preliminary immersion solution.

FIRST EMBODIMENT

A silver-palladium plating layer with palladium plating of 0.01 μm is formed by immersing a high density printed circuit board passing through a pretreatment process in a substitution palladium plating solution to plate the high density printed circuit board at a temperature of 50° C. for 1 minute after forming silver plating of 0.1 μm by immersing the high density printed circuit board in a substitution silver plating solution to plate the high density printed circuit board at a temperature of 50° C. for 1 minute.

SECOND EMBODIMENT

A silver-palladium plating layer is formed by the same method as the first embodiment except that silver plating is formed with a thickness of 0.3 μm for a silver plating time of 3 minutes.

THIRD EMBODIMENT

A silver-palladium plating layer is formed by the same method as the first embodiment except that silver plating is formed with a thickness of 1.0 μm for a silver plating time of 10 minutes.

FOURTH EMBODIMENT

A silver-palladium plating layer is formed by the same method as the first embodiment except that silver plating is formed with a thickness of 2.0 μm for a silver plating time of 20 minutes.

FIFTH EMBODIMENT

A silver-palladium plating layer is formed by the same method as the first embodiment except that silver plating is formed with a thickness of 0.05 μm for a silver plating time of 30 seconds.

SIXTH EMBODIMENT

A silver-palladium plating layer is formed by the same method as the first embodiment except that silver plating is formed with a thickness of 0.3 μm for a silver plating time of 3 minutes and palladium plating is formed with a thickness of 0.07 μm for a palladium plating time of 7 minutes.

SEVENTH EMBODIMENT

A silver-palladium plating layer is formed by the same method as the first embodiment except that silver plating is formed with a thickness of 1.0 μm for a silver plating time of 10 minutes and palladium plating is formed with a thickness of 0.07 μm for a palladium plating time of 7 minutes.

EIGHTH EMBODIMENT

A silver-palladium plating layer is formed by the same method as the first embodiment except that silver plating is formed with a thickness of 2.0 μm for a silver plating time of 20 minutes and palladium plating is formed with a thickness of 0.1 μm for a palladium plating time of 10 minutes.

NINTH EMBODIMENT

A silver-palladium plating layer is formed by the same method as the first embodiment except that silver-selenium alloy plating is formed with a thickness of 0.35 μm by plating a high density printed circuit board at a temperature of 50° C. for 210 seconds using a silver-selenium alloy plating solution (Galaxy of YMT. Co. Ltd. is used).

TENTH EMBODIMENT

A silver-palladium plating layer is formed by the same method as the first embodiment except that silver-selenium alloy plating is formed with a thickness of 0.8 µm by plating a high density printed circuit board at a temperature of 50° C. for 8 minutes using a silver-selenium alloy plating solution (Galaxy of YMT. Co. Ltd. is used).

ELEVENTH EMBODIMENT

A silver-palladium plating layer is formed in such a way that a high density printed circuit board passing through a pretreatment process is immersed in a substitution silver plating solution and plated at a temperature of 50° C. for 1 minute to form silver plating of 0.1 µm, immersed in a palladium catalyst (CATA 855 of YMT. Co. Ltd. is used) with a palladium concentration of 25 ppm at a temperature of 25° C. for 1 minute, and immersed in a reduction electroless palladium plating solution (ELP of YMT. Co. Ltd. is used) and plated at a temperature of 40° C. for 1 minute to form a palladium-phosphorus plating layer with palladium alloy plating of 0.01 µm.

TWELFTH EMBODIMENT

A silver-palladium plating layer is formed by the same method as the eleventh embodiment except that a palladium-boron alloy plating layer with palladium alloy plating of 0.01 µm is formed by immersing a high density printed circuit board in a reduction electroless palladium plating solution to plate the high density printed circuit board at a temperature of 50° C. for 1 minute.

THIRTEENTH EMBODIMENT

A silver-palladium plating layer is formed by forming silver-selenium alloy plating with a thickness of 0.5 µm for a silver alloy plating time of 5 minutes using a silver-selenium alloy plating solution and forming palladium-phosphorus alloy plating with a thickness of 0.07 µm for a palladium alloy plating time of 7 minutes using an electroless palladium-phosphorus alloy plating solution.

FOURTEENTH EMBODIMENT

A silver-palladium plating layer is formed by forming silver-selenium alloy plating with a thickness of 0.5 µm for a silver alloy plating time of 5 minutes using a silver-selenium alloy plating solution and forming palladium-boron alloy plating with a thickness of 0.05 µm for a palladium alloy plating time of 5 minutes using an electroless palladium-boron alloy plating solution.

FIFTEENTH EMBODIMENT

After forming a plating layer by the same method as the first embodiment, a high density printed circuit board is immersed in a post-treatment solution of 50° C. for 1 minute to be post-treated and dried.

SIXTEENTH EMBODIMENT

A silver-palladium plating layer is formed by the same method as the first embodiment except that silver plating is formed with a thickness of 0.1 µm by plating a high density printed circuit board at a temperature of 70° C. for 5 minutes using an electroless reduction silver plating solution.

SEVENTEENTH EMBODIMENT

A palladium-phosphorus alloy plating layer with palladium alloy plating of 0.03 µm is formed by immersing a high density printed circuit board in a reduction electroless palladium plating solution to plate the high density printed circuit board at a temperature of 50° C. for 3 minutes after forming silver plating with a thickness of 0.2 µm by plating the high density printed circuit board at a temperature of 70° C. for 10 minutes using an electroless reduction silver plating solution.

FIRST COMPARATIVE EXAMPLE

A silver plating layer is formed with a thickness of 0.1 µm by immersing a printed circuit board passing through a pretreatment process in a substitution silver plating solution.

SECOND COMPARATIVE EXAMPLE

A printed circuit board passing through a pretreatment process is catalyzed with palladium, and then a gold plating layer is formed with a thickness of 0.07 µm by electroless substitution gold plating after forming a nickel-phosphorus plating layer, which consists of nickel 91.3 wt % and phosphorus 8.7 wt %, with a thickness of 4.5 µm by electroless nickel plating.

Test Contents

1. Solder Ball Shear Test

A sample is fixed to a table to measure connection strength between a soldering pad portion and a solder ball. A ball shear test is performed by setting predetermined load and shear height (75 µm) to measure a value at which a bump is broken by pushing of a stylus.

Evaluation criteria: it is determined as normal when ball shear strength exceeds 500 gf.

2. Solder Ball Spreading Test

A solder ball with a size of φ0.3 mm is placed on a soldering pad portion after fluxing the soldering pad portion. The size of the solder ball is measured after the solder ball passes through a reflow machine (245° C.). The more the solder ball spreads, that is, the larger the size of the solder ball is, it is determined that solderability is excellent.

Evaluation criteria: it is determined that solderability is normal when the size of the solder ball after reflow is larger than 3 times of the initial size of the solder ball.

3. Wire Bondability Test

It is to test adhesion between a bonding wire and a bonding portion. Strength until bonding is separated is represented after thermal aging at a temperature of 175° C. for 1 hour by a wire bonding test machine.

Evaluation criteria: it is determined as normal when the strength is greater than minimum 3 gf and average 5 gf.

4. Electromigration test

Migration is observed by detecting a change in resistance while maintaining high temperature, high humidity, and pressure test environment in a thermo-hygrostat, which is given by test coupons provided in JIS Z 3284, for 1000 hours. The test conditions are relative humidity 85%, temperature 85° C., and DC voltage 50 volts, and water with resistance of 10 to 18MΩ/mm is used.

Evaluation criteria: a surface insulation resistance value is reduced when ion migration occurs on a plating layer, and it is determined that migration occurs when a surface insulation resistance value is below $1 \times 10^6 \Omega$.

5. Flex Cracking

It is determined as normal when flex cracking does not occur on a surface of a sample after bending the sample more than 10 times.

FIG. 6 is a view showing test results for various specific embodiments of the present invention. FIG. 6 shows the test results of the above-described six items.

As shown in FIG. 6, printed circuit boards (first to seventeenth embodiments), on which silver-palladium plating layers in accordance with embodiments of the present invention are formed, all have ball shear strength greater than 500 gf, ball spreadability greater than 0.9 mmΩ, wire bondability greater than 5 gr, surface insulation resistance greater than $1\times10^6 \Omega$, and no flex cracking when bent more than 20 times. Therefore, the first to seventeenth embodiments of the present invention all show excellent characteristics corresponding to the evaluation criteria.

In contrast, the first comparative example corresponds to all of the evaluation criteria, but the second comparative example shows flex cracking in average 1.6 times of bending tests.

Hereinafter, test results of characteristics of the silver-palladium plating layers of the first embodiment and the thirteenth embodiment and the plating layer of the first comparative example in accordance with the present invention will be described.

1. Plating Thickness Measurement

The thickness of the silver plating layer and the palladium plating layer of the first embodiment and the thirteenth embodiment is measured by a plating thickness measuring instrument so as to check whether the plating layer of the sample has a thickness suitable for required specifications, and the thickness of the plating layer of the first comparative example is measured.

2. Porosity Test

A plated BGA printed circuit board for packages is immersed in nitric acid to check with the naked eye whether pores occur due to corrosion of tissues of the silver plating layer and the palladium plating layer.

3. Heat Resistance Test

After a printed circuit board passes through reflow equipment 3 times under the condition of table 1, a change in surface color is observed to check whether the plating layer is discolored due to heat.

4. Adhesion Test

It is checked whether the plating layer is peeled by attaching an adhesive tape to a surface of the silver plating layer or the palladium plating layer.

5. Discoloration Resistance Test

It is checked whether the plating layer is discolored by immersing a plated high density printed circuit board in a 5% $K_2S$ solution for 1 minute.

TABLE 1

| | | | Test results | | |
|---|---|---|---|---|---|
| Test items | Standards | Test contents | First embodiment | Thirteenth embodiment | First comparative example |
| Plating thickness | Silver plating layer: greater than 0.05 μm, palladium plating layer: greater than 0.005 μm | Measurement using X-ray thickness measuring instrument | ○ | ○ | ○ |
| Porosity | No corrosion and discoloration of silver plating layer and palladium plating layer | Immersion in 12% nitric acid for 15 minutes | ○ | ○ | ○ |
| Heat resistance | No abnormalities on surfaces of silver plating layer and palladium plating layer such as discoloration after reflow | Surface observation after passing through IR reflow machine consecutively 3 times, maximum temperature 245° C. | ○ | ○ | ○ |
| Adhesion | No peeling of surface of plating layer after tape test | Surface observation after attaching 3M tape to surface of plating layer and separating 3M tape from surface of plating layer | ○ | ○ | ○ |
| Discoloration resistance | No discoloration of plating layer after discoloration test | Immersion in 5% $K_2S$ solution for 1 minute | ○ | ○ | X |

(○: good, X: bad)

As shown in the table 1, the first embodiment and the thirteenth embodiment of the present invention show good results in the plating thickness, porosity, heat resistance, adhesion, and discoloration resistance tests, but the first comparative example is determined as bad since the surface of the plating layer is discolored after being immersed in a 5% $K_2S$ solution.

Eventually, in the present invention, the silver-palladium plating layer, which is formed by mixing the silver plating layer and the palladium plating layer formed through the silver plating step and the palladium plating step has high solderability like conventional substitution silver plating or electroless nickel plating and electroless gold plating, excellent effects in preventing oxidation and discoloration, which are disadvantages of the substitution silver plating, and no failures such as separation of components, bending, and cracks like in the electroless nickel plating and the electroless gold plating. Further, while a plating process time for obtaining the most desirable properties is usually about 45 minutes in the electroless nickel plating and the electroless gold plating, it takes about 15 minutes in the present invention. Therefore, since a process time is greatly reduced to enable production in a horizontal line, it is possible to achieve remarkable improvement of productivity. Further, since gold (Au), an expensive material, is not used, it is possible to achieve remarkable reduction of costs.

Since a substrate structure in accordance with the present invention can prevent corrosion and discoloration of a conductive pattern used as a circuit pattern of a printed circuit board, it is possible to improve soldering and wire bonding characteristics for the conductive pattern.

Since a substrate structure in accordance with the present invention can sufficiently increase a thickness of a silver plating layer for preventing corrosion and discoloration of a conductive pattern used as a circuit pattern of a printed circuit board, it is possible to improve soldering and wire bonding characteristics for the conductive pattern. Especially, since a substrate structure in accordance with an embodiment of the present invention can effectively form a silver plating layer with a thickness greater than 5 μm in a wire bonding process requiring a thickness greater than about 5 μm, it is possible to improve wire bonding characteristics.

Since a method of manufacturing a circuit board in accordance with the present invention can prevent corrosion and discoloration of a plating layer for soldering and wire bonding characteristics on a conductive pattern used as a circuit pattern of a printed circuit board, it is possible to improve characteristics of subsequent soldering and wire bonding processes.

Since a method of manufacturing a circuit board in accordance with the present invention can effectively form a silver plating layer with a desired thickness on a conductive pattern by an electroless reduction plating process, it is possible to improve wire bonding characteristics.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A substrate structure comprising:
    a base substrate on which a conductive pattern is formed;
    a first plating layer covering the conductive pattern, the first plating layer made of a silver alloy that consists of 99.000 to 99.999 wt % of silver and 0.001 to 1.0 wt % of at least one metal selected from selenium and lead; and
    a second plating layer covering the first plating layer, the second plating layer made of a palladium alloy that consists of 92 to 99.9 wt % of palladium and 0.1 to 8.0 wt % of at least one element selected from phosphorus (P) and boron (B),
    wherein the first plating layer comprises an electroless reduction plating layer.

2. The substrate structure according to claim 1, wherein the conductive pattern comprises copper (Cu).

3. The substrate structure according to claim 1, wherein the conductive pattern comprises:
    a first pattern on which a soldering process for mounting of electronic components is performed; and
    a second pattern on which a wire bonding process for electrical connection with electronic components is performed, wherein the second plating layer covering the second pattern has a thickness larger than that of the first plating layer covering the first pattern.

4. The substrate structure according to claim 3, wherein the second plating layer covering the second pattern has a thickness greater than 5 μm.

5. The substrate structure according to claim 1, wherein the second plating layer comprises an immersion substitution plating layer.

6. The substrate structure according to claim 1, further comprising:
    a resist pattern covering the base substrate while exposing the conductive pattern.

* * * * *